US010562061B2

(12) United States Patent
Qu et al.

(10) Patent No.: US 10,562,061 B2
(45) Date of Patent: Feb. 18, 2020

(54) ADHESIVE DISPENSER

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Litao Qu, Beijing (CN); Biao Tian, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/985,116

(22) Filed: May 21, 2018

(65) Prior Publication Data

US 2019/0015864 A1 Jan. 17, 2019

(30) Foreign Application Priority Data

Jul. 11, 2017 (CN) .................... 2017 2 0835083 U

(51) Int. Cl.

*B05C 5/02* (2006.01)
*H01L 51/52* (2006.01)
*B05C 11/10* (2006.01)
*B05C 17/00* (2006.01)

(52) U.S. Cl.

CPC .......... *B05C 5/0279* (2013.01); *B05C 5/0225* (2013.01); *B05C 5/0275* (2013.01); *B05C 11/1013* (2013.01); *B05C 11/1044* (2013.01); *H01L 51/5246* (2013.01); *B05C 17/002* (2013.01)

(58) Field of Classification Search

CPC . B05C 5/0279; B05C 5/0225; B05C 11/1044; B05C 11/1013; H01L 51/5246
USPC .................................................. 222/399, 144
See application file for complete search history.

(56) References Cited

U.S. PATENT DOCUMENTS

| | | | | | |
|---|---|---|---|---|---|
| 5,074,443 | A * | 12/1991 | Fujii | B05C 5/0225 | 118/684 |
| 5,808,559 | A * | 9/1998 | Buckler | B05C 5/0225 | 340/606 |
| 5,875,922 | A * | 3/1999 | Chastine | B05C 5/02 | 222/1 |
| 6,010,740 | A * | 1/2000 | Rutledge | B05C 5/0216 | 427/8 |
| 6,257,445 | B1 * | 7/2001 | Means | B05C 5/0225 | 222/1 |
| 6,318,599 | B2 * | 11/2001 | Estelle | B05C 5/001 | 222/146.5 |

(Continued)

*Primary Examiner* — Donnell A Long
(74) *Attorney, Agent, or Firm* — Kinney & Lange, P.A.

(57) ABSTRACT

An adhesive dispenser is includes a plurality of adhesive dispensing parts, each including an adhesive dispensing tube, an adhesive extrusion assembly, and a driving component. The adhesive dispensing tube is configured to carry an adhesive therein. The adhesive extrusion assembly is connected with the adhesive dispensing tube, and is configured to apply a pressure to the adhesive in the adhesive dispensing tube such that the adhesive is dispensed from the adhesive dispensing tube. The driving component is configured to drive adhesive extrusion assemblies of the plurality of adhesive dispensing parts to apply the pressure to the adhesive.

14 Claims, 7 Drawing Sheets

(56) References Cited

U.S. PATENT DOCUMENTS

| | | | | |
|---|---|---|---|---|
| 6,354,471 | B2 * | 3/2002 | Fujii | B05C 5/0225 222/325 |
| 8,453,876 | B2 * | 6/2013 | Miller | B44D 3/003 222/1 |
| 2006/0272734 | A1 * | 12/2006 | Kweon | B05C 5/0225 222/394 |
| 2014/0117049 | A1 * | 5/2014 | Varga | B05C 11/1034 222/146.5 |
| 2018/0207674 | A1 * | 7/2018 | Jiang | B05C 5/00 |

* cited by examiner

ADHESIVE DISPENSER

CROSS-REFERENCE TO RELATED APPLICATION

This application claims the priority benefit of the Chinese Patent Application No. 201720835083.5 filed on Jul. 11, 2017 in the State Intellectual Property Office of China, the whole disclosure of which is incorporated herein by reference.

BACKGROUND

The present disclosure relates to an adhesive dispenser.

Organic Light-Emitting Devices (OLED) are used for lighting and in displays. The useful life of an OLED is easily impaired by moisture in the ambient environment entering the OLED display. If the OLED display is sealed in a no-moisture environment, the life of the OLED display may be prolonged significantly. A packaging technique for OLED displays is consequently critical for improving display life.

SUMMARY

At least one embodiment of the present disclosure is directed to an adhesive dispenser, including: a plurality of adhesive dispensing parts, each of at least one of the plurality of adhesive dispensing parts including: an adhesive dispensing tube configured to accommodate an adhesive therein; and an adhesive extrusion assembly connected with the adhesive dispensing tube, and configured to apply a pressure to the adhesive in the adhesive dispensing tube such that the adhesive is dispensed from the adhesive dispensing tube; and a driving component configured to drive adhesive extrusion assemblies of the plurality of adhesive dispensing parts to apply the pressure to the adhesive.

In certain embodiments, the driving component is configured to sequentially drive the adhesive extrusion assemblies of the plurality of adhesive dispensing parts to apply the pressure to adhesives in the plurality of adhesive dispensing parts in turn.

In certain embodiments, each adhesive dispensing tube includes a nozzle for discharging the adhesive and a joint, the nozzle and the joint being at two opposite sides of the adhesive dispensing tube respectively.

In certain embodiments, the adhesive extrusion assembly includes a gas inlet pipe and a striker, the gas inlet pipe being configured to input a gas into the adhesive dispensing tube, the striker extending through the joint and being configured to be movable between a first position, in which the striker blocks the nozzle so as to prevent outflow of the adhesive, and a second position, in which the striker opens the nozzle so as to allow the adhesive to flow out under action of the gas.

In certain embodiments, the striker is configured to be in the first position in a state that the driving component is not actuated.

In certain embodiments, the driving component includes an electromagnetic member, the electromagnetic member being configured to generate a magnetic field to attract the striker in each of adhesive extrusion assemblies of the plurality of adhesive dispensing parts to move from the first position to the second position so as to open the nozzle.

In certain embodiments, the electromagnetic member is configured to generate the magnetic field to sequentially attract strikers in respective adhesive extrusion assemblies of the plurality of adhesive dispensing parts so as to sequentially open nozzles of the plurality of adhesive dispensing parts.

In certain embodiments, the adhesive extrusion assembly includes an extrusion stem and a spring retractable structure, the spring retractable structure is in the adhesive dispensing tube and includes a spring, and the extrusion stem extends through the joint to be connected with the spring retractable structure and is configured to be movable between a first position, in which the extrusion stem allows the spring to be in a relaxation state so as to prevent the adhesive from flowing out of the nozzle, and a second position, in which the spring is pressed into a compressed state by the extrusion stem so as to impel the adhesive to flow out of the nozzle.

In certain embodiments, the driving component includes a vertical turntable and a push rod connected with the vertical turntable, and the push rod is moveable up and down as the vertical turntable rotates so as to press the extrusion stem such that the extrusion stem is moved from the first position to the second position.

In certain embodiments, the spring retractable structure further includes a stop part and a movable adhesive extrusion member, the stop part being fixed onto the adhesive dispensing tube, the movable adhesive extrusion member being connected with the extrusion stem and in contact with the adhesive, the movable adhesive extrusion member having an outer edge abutting against an inner surface of the adhesive dispensing tube, and two ends of the spring are connected with the stop part and the movable adhesive extrusion member respectively.

In certain embodiments, the adhesive dispenser further includes a carrying member carrying the plurality of adhesive dispensing parts.

In certain embodiments, the carrying member includes a rotatable carrying plate.

In certain embodiments, the plurality of adhesive dispensing parts are distributed around a rotation axis of the rotatable carrying plate.

In certain embodiments, the plurality of adhesive dispensing parts are arranged on the rotatable carrying plate along a circular trajectory about the rotation axis.

In certain embodiments, the carrying member includes a fixed carrying plate.

In certain embodiments, the adhesive dispenser further includes a force application disk, the force application disk being between the driving component and the fixed carrying plate and configured to transfer a force applied by the driving component to the adhesive extrusion assemblies.

In certain embodiments, the driving component includes a vertical turntable and a push rod connected with the vertical turntable, the push rod being movable up and down as the vertical turntable rotates so as to push and press the force application disk to thereby apply the force to the adhesive extrusion assembly.

In certain embodiments, at least one of the adhesive dispensing parts further includes a liquid level sensor configured to sense whether or not a liquid level of the adhesive is lower than a set position.

In certain embodiments, at least one of the adhesive dispensing parts further includes a temperature control sensor configured to sense a temperature of the adhesive.

In certain embodiments, each of the adhesive dispensing parts further includes an adhesive supply pipe configured to supply the adhesive to the adhesive dispensing tube.

BRIEF DESCRIPTION OF THE DRAWINGS

In order to more clearly illustrate the technical solutions of the embodiments of the present disclosure, the drawings, which are used in the description of the embodiments, will be briefly described below. It will be apparent that the drawings in the following description only represent some embodiments of the present disclosure and are not limitative to the present disclosure.

DETAILED DESCRIPTION

Figure 1:
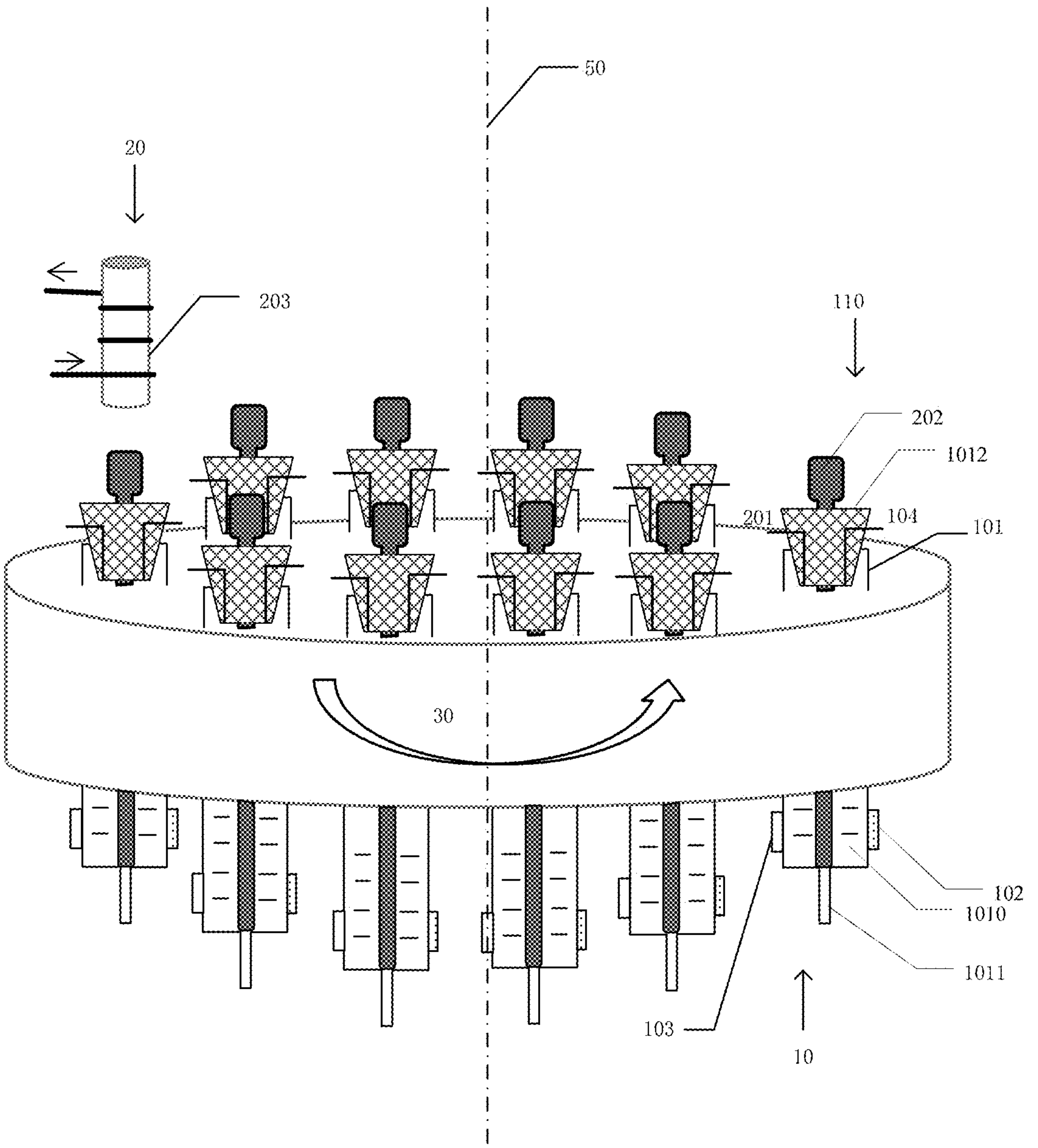
FIG. 1 is a schematic diagram showing an adhesive dispenser according to an embodiment of the present disclosure.

In order that objectives, technical solutions, and advantages of the present disclosure become clearer, technical solutions of the present disclosure will be further described in detail below with reference to the accompanying drawings in embodiments of the present disclosure. Apparently, the described embodiments are merely some but not all of the present disclosure. All other embodiments obtained by those skilled in the art based on the described embodiments of the present disclosure without any creative efforts shall fall within the scope of the present disclosure.

Unless otherwise defined, technical or science terms used in the present disclosure may have the same meanings that are generally understood by a person skilled in the art. Words such as “first,” “second,” and the like used in the present disclosure may refer to various different elements, but are not intended to indicate any order, number or importance. Also, terms such as “include,” “comprise,” “have,” or the like indicates that an element or object listed before the term contains or covers elements or object and equivalents thereof listed after the term, but do not exclude other elements or objects. Wordings such as “connect,” “connected with,” and the like are not limited to a physical or mechanical connection, and may include an electrical connection, regardless of a direct or indirect connection. Terms such as “up,” “down,” “left,” “right,” and the like only indicate relative positional relationships, which may be changed correspondingly when an absolute position of a described object varies.

The OLED is generally packaged through a Dam-filler packaging (also called as surface packaging) process. For example, a packaging substrate is firstly placed on a base, then a sealant (Dam) is coated over the packaging substrate, next an adhesive (filler adhesive) is filled inside of the sealant through an adhesive dispensing unit; the sealant is in a ring shape, and the adhesive is ejected from a nozzle at an adhesive outlet of the adhesive dispensing unit to a designated spot, which may also be referred to as a dotting spot. Finally, the packaging substrate filled thereon with the adhesive and a base substrate provided with the OLED device are laminated and engaged with each other and cured.

Effects of the packaging process have an important influence on the useful life of the OLED device, and the stability of the packaging adhesive will affect the effects of the packaging process to be larger extent. Performances of the OLED device may be improved by improving the packaging process.

A conventional adhesive dispenser generally uses a few adhesive dispensing parts to complete packaging of a whole glass substrate. Use frequency of each adhesive dispensing part will increase, and the adhesive dispensing part will have a poorer stability and an increased damage frequency, which is not in favor of packaging stability. In addition, if the few adhesive dispensing parts are often used for adhesive packaging and dotting, the tact time will be longer, which is not favorable in improving production capacity.

FIG. 1 shows an adhesive dispenser according to at least one embodiment of the present disclosure. As shown in FIG. 1, the adhesive dispenser includes a plurality of adhesive dispensing parts 10 and a driving component 20. Each of at least one of the plurality of adhesive dispensing parts 10, for example, each of the plurality of adhesive dispensing parts 10, includes an adhesive dispensing tube 101 and an adhesive extrusion assembly 110, and the adhesive dispensing tube 101 is configured to accommodate an adhesive 1010. The adhesive extrusion assembly 110 is connected with the adhesive dispensing tube 101 and configured to apply a pressure to the adhesive 1010 in the adhesive dispensing tube 101 such that the adhesive 1010 is dispensed from the adhesive dispensing tube 101. The driving component 20 is configured to drive adhesive extrusion assemblies 110 of the plurality of adhesive dispensing parts 10 to apply the pressure to the adhesive.

As an example, the driving component 20 may be configured to sequentially drive the adhesive extrusion assemblies 110 of the plurality of adhesive dispensing parts 10 to apply the pressure to adhesives 1010 in the plurality of adhesive dispensing parts 10 respectively. Alternatively, as an example, the driving component 20 may also be configured to simultaneously drive the respective adhesive extrusion assemblies 110 of the plurality of adhesive dispensing parts 10.

In the adhesive dispenser provided according to at least one embodiment of the present disclosure, a plurality of adhesive dispensing parts are used so as to reduce the use frequency of a certain one adhesive dispensing part, which facilitates improving dispensing precision and reducing damage frequency, and may also reduce the tact time.

For example, the adhesive 1010 may be viscous adhesive, may be an adhesive commonly used in the packaging process, for example, may include an epoxy resin, but is not limited to this.

In the adhesive dispenser according to an embodiment of the present disclosure, as shown in FIG. 1, the adhesive dispenser may further include a carrying member 30, and the carrying member 30 is configured to carry the plurality of adhesive dispensing parts 10, thereby improving stability of the adhesive dispenser in dispensing the adhesive in the packaging process.

In the adhesive dispenser according to an embodiment of the present disclosure, as shown in FIG. 1, the carrying member 30 includes a rotatable carrying plate (for example, having a circular or polygonal shape). Thereby, the plurality of adhesive dispensing parts 10 may sequentially dispense the adhesive, which may reduce the use frequency of a certain one adhesive dispensing part 10, facilitating improving dispensing precision and reducing damage frequency, reducing the tact time.

In the adhesive dispenser according to an embodiment of the present disclosure, as shown in FIG. 1, the plurality of adhesive dispensing parts 10 may be distributed around a rotation axis 50 of the rotatable carrying plate, for facilitating dispensing of the adhesive. For example, the plurality of adhesive dispensing parts 10 may be arranged on the rotatable carrying plate along a circular trajectory about the rotation axis 50.

Figure 2:
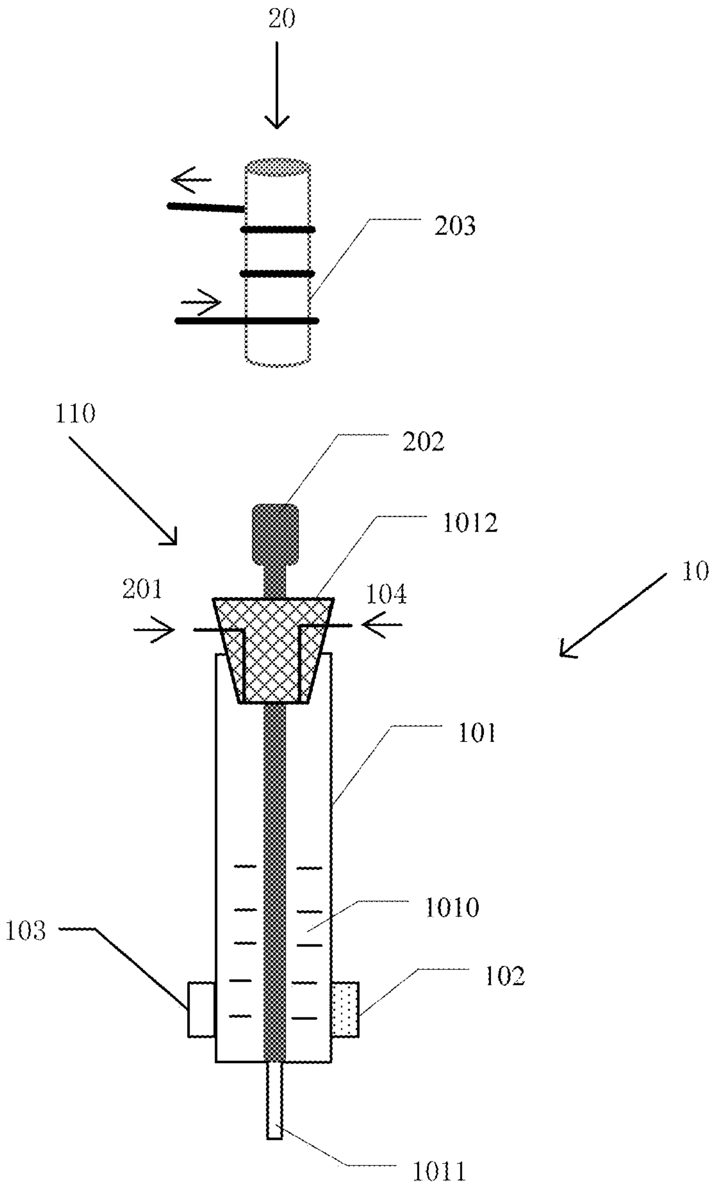
FIG. 2 is a schematic diagram showing an adhesive dispensing part and a driving component of the adhesive dispenser shown in FIG. 1.

FIG. 2 is a schematic diagram showing a single adhesive dispensing part and a corresponding driving component. In the adhesive dispenser according to an embodiment of the present disclosure, as shown in FIGS. 1 and 2, in order to determine residual state of the adhesive and to prevent insufficient amount of adhesive in the adhesive dispensing tube from affecting dispensing of the adhesive during dispensing adhesive, at least one adhesive dispensing part 10 may further include a liquid level sensor 102 configured to sense whether or not a liquid level of the adhesive 1010 is lower than a set position.

In the adhesive dispenser according to an embodiment of the present disclosure, as shown in FIGS. 1 and 2, at least one adhesive dispensing part 10 may further include a temperature control sensor 103 configured to sense a temperature of the adhesive 1010, thereby it is possible to maintain the adhesive in the adhesive dispensing tube at a given temperature for facilitating dispensing the adhesive.

In the adhesive dispenser according to an embodiment of the present disclosure, as shown in FIGS. 1 and 2, in order to re-supply the adhesive before/after running out the adhesive or to supply the adhesive to adhesive dispensing tube as required, each adhesive dispensing part 10 may further include an adhesive supply pipe 104 configured to supply the adhesive 1010 to the adhesive dispensing tube 101.

In the adhesive dispenser according to an embodiment of the present disclosure, as shown in FIGS. 1 and 2, the adhesive dispensing tube 101 includes a nozzle 1011 and a joint 1012. The nozzle 1011 may be configured for discharging the adhesive 1010. The nozzle 1011 and the joint 1012 are located at two opposite sides of the adhesive dispensing tube 101 respectively. As shown in FIGS. 1 and 2, the nozzle 1011 is located at an upper side of the adhesive dispensing tube 101, and the joint 1012 is located at a lower side of the adhesive dispensing tube 101.

In the adhesive dispenser according to an embodiment of the present disclosure, as shown in FIGS. 1 and 2, the adhesive extrusion assembly 1100 includes a gas inlet pipe 201 and a striker 202, the gas inlet pipe 201 is configured to input a gas into the adhesive dispensing tube 101, the striker 202 extends through the joint 1012 and is configured to be movable between a first position (when not dispensing the adhesive) in which the striker 202 blocks the nozzle 1011 so as to prevent outflow of the adhesive 1010 and a second position (when dispensing the adhesive) in which the striker 202 opens the nozzle 1011 so as to allow the adhesive 1010 to flow out under action of the gas. As an example, the striker 202 may be configured to be in the first position in a state of the driving component 20 being not actuated, thereby the nozzle 1011 is in a normally-closed state. In an example, the driving component 20 includes an electromagnetic member 203. The electromagnetic member 203 is configured to generate a magnetic field to attract the striker 202 in each of adhesive extrusion assemblies 1100 of the plurality of adhesive dispensing parts 10 to move from the first position to the second position so as to open the nozzle 1011, such that the adhesive 1010 is dispensed under the action of the gas. As an example, the electromagnetic member 203 may be configured to generate the magnetic field to sequentially attract strikers 202 in respective adhesive extrusion assemblies 1100 of the plurality of adhesive dispensing parts 10 so as to sequentially open nozzles 1011 of the plurality of adhesive dispensing parts 10.

Figure 3:
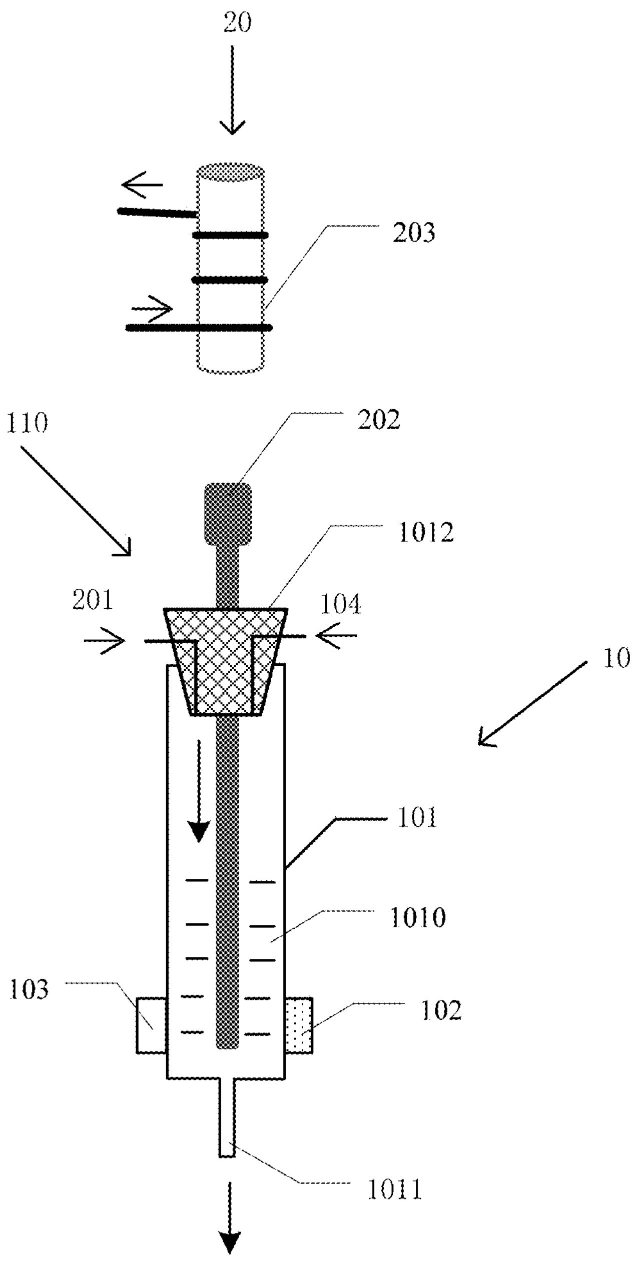
FIG. 3 is a schematic diagram showing a striker of the adhesive dispenser shown in FIG. 2 in a raised state.

FIG. 3 is a schematic diagram showing a state where the striker 202 is attracted to raise up such that the gas inputted into the adhesive dispensing tube presses the adhesive so as to dispense the adhesive. For example, the gas may be always inputted during dispensing the adhesive, but the present disclosure is not limited to this.

As shown in FIG. 1, the carrying member 30 is rotatable, and the electromagnetic member 203 may correspond to one of the adhesive dispensing parts 10 carried on the carrying member 30. The rotatable carrying member 30 may be rotated at a fixed speed, and after the carrying member 30 is rotated to a position below the electromagnetic member 203, the electromagnetic member is powered to generate a magnetic field, so that the striker 202 is attracted to raise up by means of a force (attraction force) applied to the striker from the magnetic field, thereby the adhesive is dispensed under the action of the inputted gas. The strength of the magnetic field and a dispensing time interval may be controlled by changing a magnitude of a current on an electrified wire and/or a rotation speed of the carrying member 30, thereby controlling an amount of dispensed adhesive. The electromagnetic member 203 may be for example an electromagnet. For example, the inputted gas may be nitrogen gas, but the present disclosure is not limited to this. Of course, also as shown in FIG. 4, the electromagnetic member 203 may also correspond to a plurality of adhesive dispensing parts 10.

Figure 4:
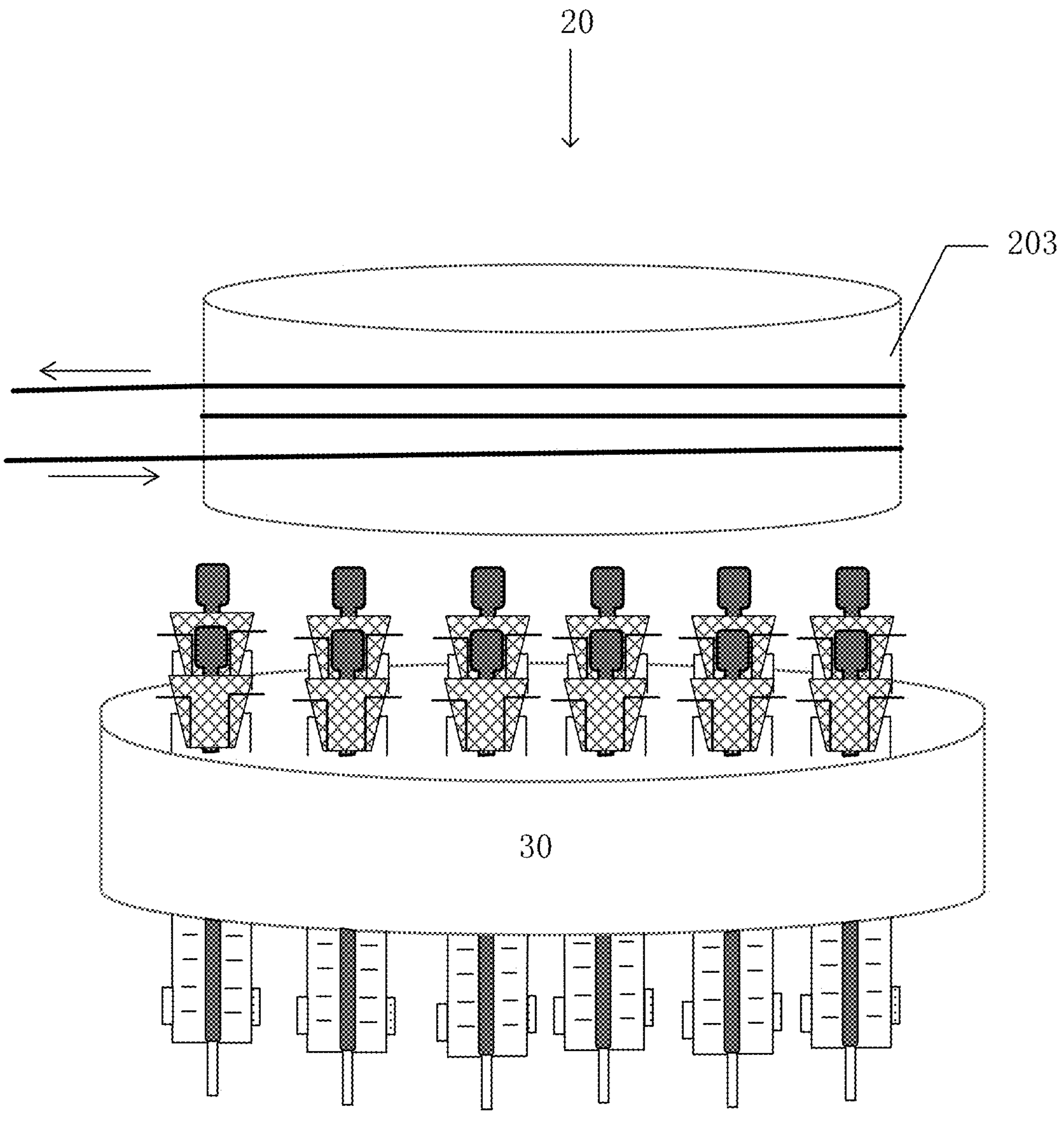
FIG. 4 is a schematic diagram showing an adhesive dispenser according to another embodiment of the present disclosure.

FIG. 4 shows an adhesive dispenser according to an embodiment of the present disclosure, which is different from the structure shown in FIG. 1 in that the carrying member 30 is a fixed carrying plate (for example, having a circular or polygonal shape), and the electromagnetic member 203 may correspond to a plurality of adhesive dispensing parts 10 carried on the carrying member 30. The electromagnetic member 203 may, after being powered, attract the strikers 202 of the corresponding plurality of adhesive dispensing parts 10, such that a gas is inputted into the plurality of adhesive dispensing parts 10 so as to enable the adhesive to be dispensed. For example, a plurality of adhesive dispensing parts 10 may be arranged in a rectangular shape and carried on the carrying member 30, and the carrying member 30 is fixed in position. The strength of the magnetic field and the dispensing time interval may be controlled by changing a magnitude of a current and energizing interval on an electrified wire, thereby controlling an amount of dispensed adhesive and an adhesive dispensing frequency.

Figure 5:
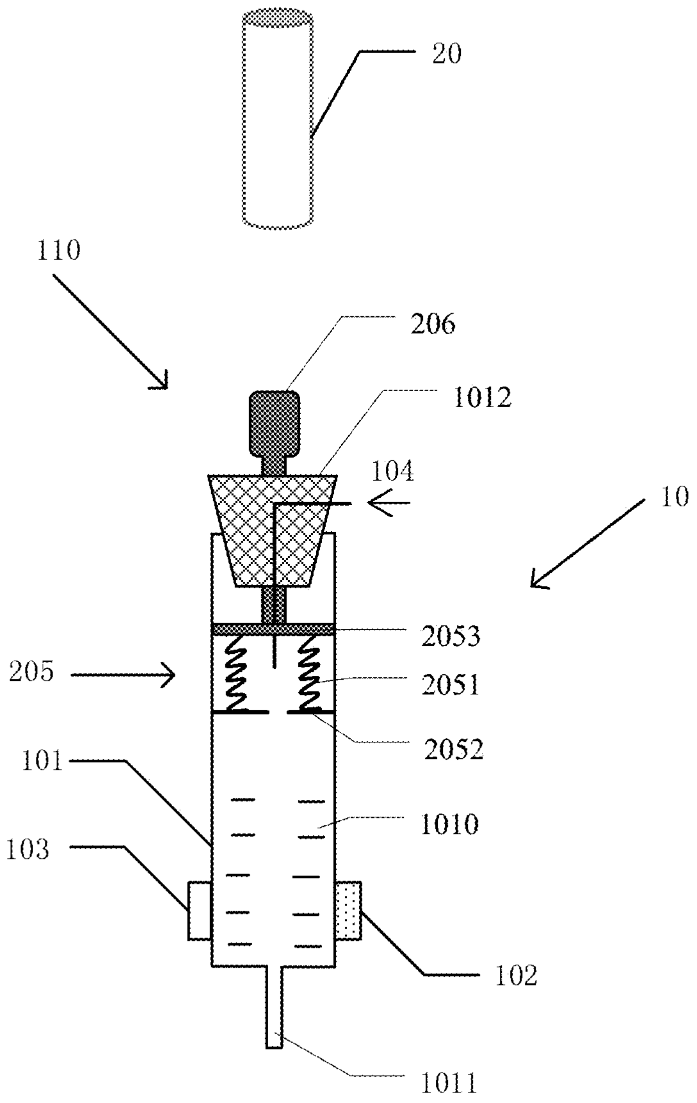
FIG. 5 is a schematic diagram showing an adhesive dispensing part and a driving component of the adhesive dispenser shown in FIG. 4.

FIG. 5 shows an adhesive extrusion assembly 110 and a driving component 20 in another configuration. As shown in FIG. 5, the adhesive extrusion assembly 110 includes an extrusion stem 206 and a spring retractable structure 205. The spring retractable structure 205 is located within the adhesive dispensing tube 101. The spring retractable structure 205 includes a spring 2051. The extrusion stem 206 extends through the joint 1012 to be connected with the spring retractable structure 205 and is configured to be movable between a first position, in which the extrusion stem 206 allows the spring 2051 to be in a relaxation state so as to prevent the adhesive 1010 from flowing out of the nozzle 1011, and a second position, in which the spring 2051 is pressed into a compressed state by the extrusion stem 206 so as to impel the adhesive 1010 to flow out of the nozzle 1011. The driving component 20 is configured to apply a force to the extrusion stem 206 to drive the spring retractable structure 205 such that the spring 2051 is in the compressed state and applies a force to the adhesive 1010 such that the adhesive is dispensed, and the spring retractable structure 205 is configured to restore its original shape and thus stop dispensing the adhesive when the extrusion stem 206 is not applied with any forces.

In an exemplary embodiment, the driving component 20 can include a vertical turntable 207 and a push rod 2071 connected with the vertical turntable, such that the push rod 2071 is moveable up and down as the vertical turntable 207 rotates so as to press the extrusion stem 206, and such that the extrusion stem 206 is moved from the first position to the second position.

In the adhesive dispenser according to an embodiment of the present disclosure, as shown in FIG. 5, the spring retractable structure 205 further includes a stop part 2052 and a movable adhesive extrusion member 2053, the stop part 2052 is fixed on the adhesive dispensing tube 101, the movable adhesive extrusion member 2053 is connected with the extrusion stem 206 and in contact with the adhesive 1010, the movable adhesive extrusion member 2053 has an outer edge abutting against an inner surface of the adhesive dispensing tube 101, and two ends of the spring 2051 are connected with the stop part 2052 and the movable adhesive extrusion member 2053 respectively. For example, the stop part 2052 may be fixed on the adhesive dispensing tube 101 when manufacturing the adhesive dispensing tube 101. For example, a material of the adhesive dispensing tube 101 may be polyvinyl chloride (PVC), and the stop part 2052 may be made of the same material as the adhesive dispensing tube 101, but the present disclosure is not limited to this. When arranging the adhesive supply pipe 104, in order to facilitate supply of the adhesive from the adhesive supply pipe 104 to the adhesive dispensing part 10, the adhesive supply pipe 104 may extend through the extrusion stem 206 from a side of the extrusion stem and then through the movable adhesive extrusion member 2053 so as to supply the adhesive to the adhesive dispensing tube 101 without affecting dispensing of the adhesive, or the adhesive supply pipe 104 may enter the adhesive dispensing tube 101 through the joint 1012 and then extends through the movable adhesive extrusion member 2053 so as to supply the adhesive to the adhesive dispensing tube 101. Arrangement of the adhesive supply pipe 104 is not limited to those described above.

As shown in FIG. 5, the extrusion stem 206 may be moved downwards and is applied with a force; the extrusion stem 206 may be driven by the driving component 20 (for example, the vertical turntable 207 and the push rod 2071) to move downwards so as to bring the movable adhesive extrusion member 2053 to move downwards, thus the adhesive can be dispensed under a downward pressure (for example, a gas pressure), and at this time, the spring 2051 is compressed. When the extrusion stem 206 is not applied with any force by the driving component 20, the extrusion stem 206 goes up under the restoring force of the spring, thereby stopping dispensing the adhesive.

Figure 6:
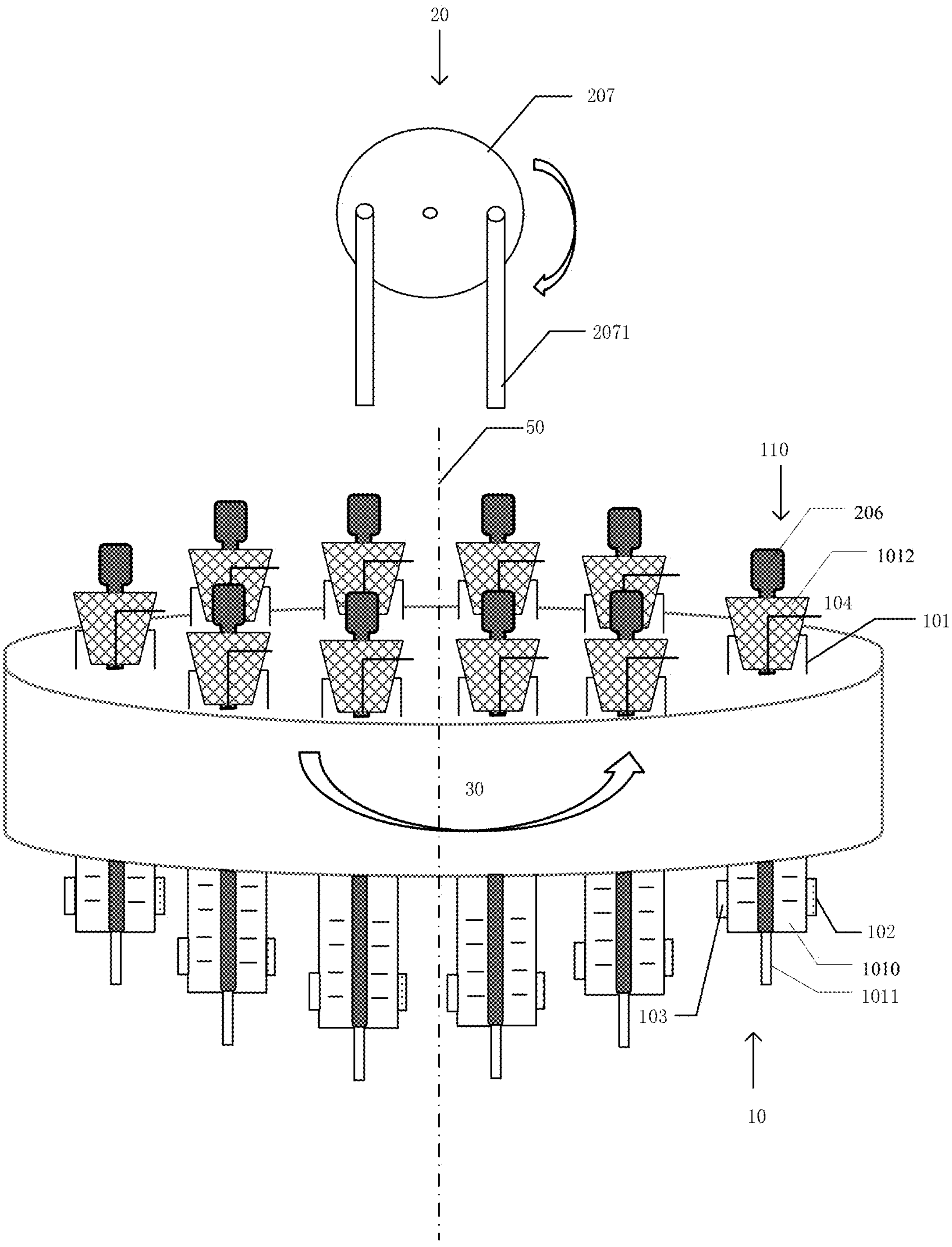
FIG. 6 is a schematic diagram showing an adhesive dispenser according to a further embodiment of the present disclosure.

FIG. 6 shows an adhesive dispenser including a plurality of the adhesive extrusion assemblies 110 shown in FIG. 5. As shown in FIG. 6, the driving component may be a vertical turntable 207, which may be rotatable to-and-fro in a certain angle range within a plane perpendicular to the carrying member 30. When the adhesive dispensing part 10 is rotated to a position below the driving component (for example, the vertical turntable 207), the dispensing of the adhesive may be controlled by pressing the extrusion stem 206 by the push rod 2071, and the adhesive dispensing amount may be controlled by a pressed height. The driving component 207 is not limited to the case shown in FIG. 6.

As shown in FIG. 6, when the push rod 2071 is rotated to a position directly facing the extrusion stem 206, the dispensing of the adhesive may be controlled by a pressing action; when the push rod 2071 continues to rotate to be separated from the extrusion stem 206, the spring retractable structure 205 will restore its original shape, thus the action of pressing the adhesive is stopped, thereby achieving an operation of dispensing the adhesive, and the adhesive dispensing amount may be controlled by a pressed height.

Figure 7:
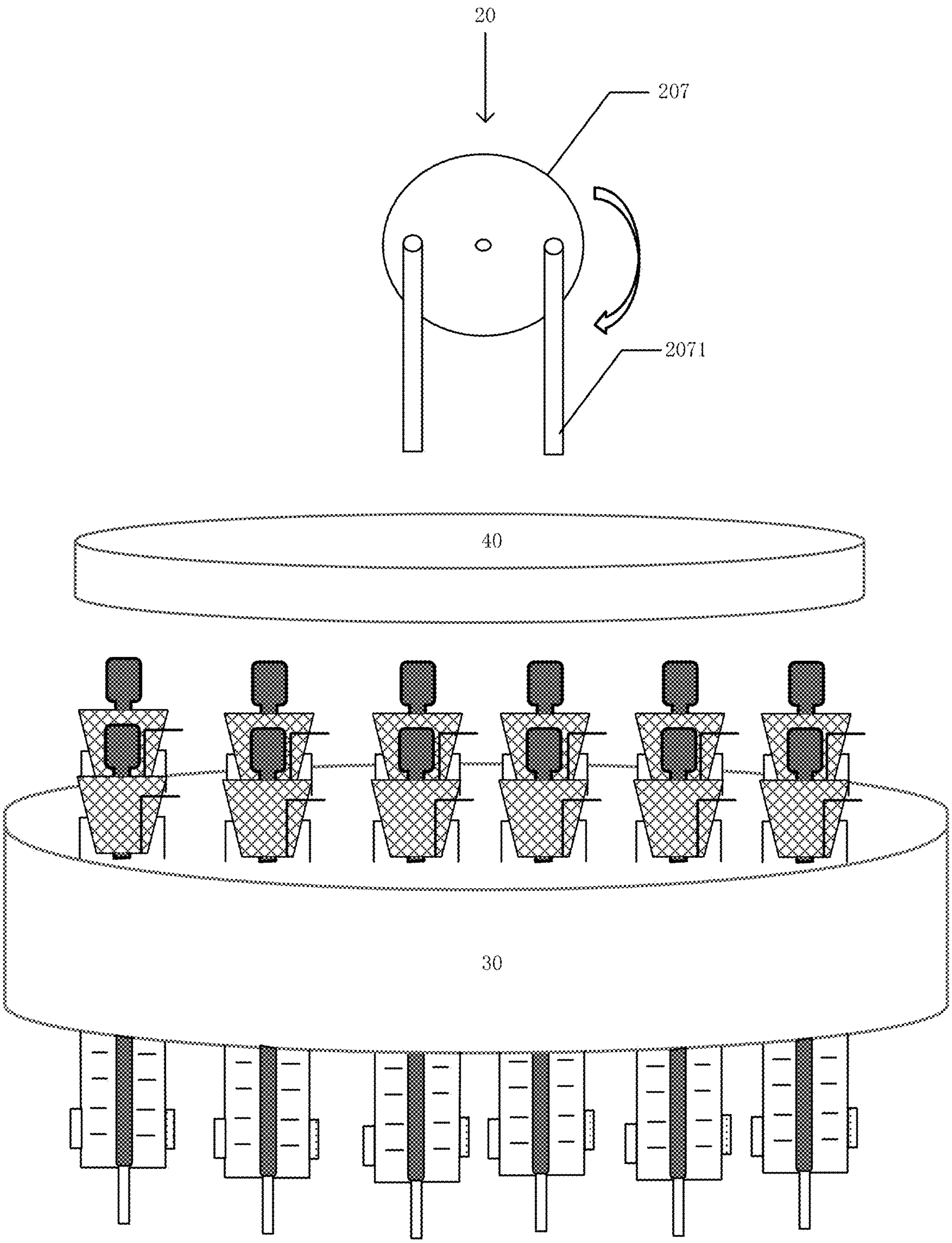
FIG. 7 is a schematic diagram showing an adhesive dispenser according to a still further embodiment of the present disclosure.

FIG. 7 shows an adhesive dispenser according to an embodiment of the present disclosure. As shown in FIG. 7, the carrying member 30 includes a fixed carrying plate (for example, a fixed disk).

As shown in FIG. 7, the adhesive dispenser according to an embodiment of the present disclosure further includes a force application disk 40. The force application disk 40 is located between the driving component and the carrying member 30 and configured to transfer a force applied by the driving component to the adhesive extrusion assemblies 20. As an example, the driving component 20 may include a vertical turntable 207 and a push rod 2071 connected with the vertical turntable 207, the push rod 2071 is movable up and down as the vertical turntable 207 rotates so as to push and press the force application disk 40 to thereby apply the force to the adhesive extrusion assembly 110.

As shown in FIG. 7, the adhesive dispensing part 10 may be arranged in a rectangular shape and carried in the carrying member 30 (which, for example, is a circular disk), and the position of the carrying member 30 is fixed; when the vertical turntable is rotated and the push rod is rotated to a position where it is in contact with the force application disk 40, the push rod 2071 will directly face a central position of the force application disk 40 and apply a force thereto, there may be a little friction between the force application disk and the carrying member 30, such that the contact point will vary in position as the push rod 2071 moves, and meanwhile, the force application disk 40 applies the force uniformly to the extrusion stems 206 of the adhesive dispensing parts 10 located below the force application disk, the dispensing of the adhesive may be controlled by an extrusion action from the extrusion stem 206, and the adhesive dispensing amount may also be controlled by controlling an extrusion height.

For example, the adhesive supply pipes 104 of the respective adhesive dispensing parts 10 may be collected into an adhesive supply main pipe, which may be connected into an adhesive supply device (for example, an adhesive supply bottle assembly), such that the adhesive may be supplied to all adhesive dispensing parts 10 from one adhesive supply device. Similarly, the gas inlet pipes may also be collected into a main gas inlet pipe, which may be connected to a gas supply device (for example, a gas supply bottle assembly), such that the gas may be supplied to all adhesive dispensing parts 10 from one gas supply device.

Will respect to the disclosure above:

(1) unless otherwise defined, repeated reference numerals represent the same elements throughout the embodiments of the present disclosure and the drawings;

(2) the drawings used in the embodiments of the present disclosure only relate to structures mentioned in the embodiments of the present disclosure, and other structures may refer to common designs; and (3) features described in an embodiment of the present disclosure may be combined with each other, and features described in different embodiments of the present disclosure may also be combined with each other.

The above described contents are merely exemplary embodiments of the disclosure, and the scope of the present disclosure is not limited thereto. Changes or alternations which are easily made by those skilled in the art should fall within the scope of the disclosure. Therefore, the scope of the disclosure should be solely defined by the scope of claims and equivalents thereof.

The invention claimed is:

1. An adhesive dispenser comprising:

a plurality of adhesive dispensing parts, each of at least one of the plurality of adhesive dispensing parts comprising:

an adhesive dispensing tube configured to accommodate an adhesive therein; and an adhesive extrusion assembly connected with the adhesive dispensing tube, and configured to apply a pressure to the adhesive in the adhesive dispensing tube such that the adhesive is dispensed from the adhesive dispensing tube; and a driving component configured to drive adhesive extrusion assemblies of the plurality of adhesive dispensing parts to apply the pressure to the adhesive, wherein each adhesive dispensing tube comprises a nozzle for discharging the adhesive and a joint, the nozzle and the joint being located at two opposite ends of the adhesive dispensing tube respectively, wherein the adhesive extrusion assembly comprises an extrusion stem and a spring retractable structure, wherein the spring retractable structure is in the adhesive dispensing tube and comprises a spring, wherein the extrusion stem extends through the joint to be connected with the spring retractable structure and is located at an end of the adhesive dispensing tube away from the nozzle, and wherein the extrusion stem is configured to be movable between a first position, in which the extrusion stem allows the spring to be in a relaxation state so as to prevent the adhesive from flowing out of the nozzle, and a second position, in which the spring is pressed into a compressed state by the extrusion stem so as to impel the adhesive to flow out of the nozzle.

2. The adhesive dispenser according to claim 1, wherein the driving component is configured to sequentially drive the adhesive extrusion assemblies of the plurality of adhesive dispensing parts to apply the pressure to adhesives in the plurality of adhesive dispensing parts in turn.

3. The adhesive dispenser according to claim 1, wherein the driving component comprises a vertical turntable and a push rod connected with the vertical turntable, and wherein the push rod is moveable up and down as the vertical turntable rotates so as to press the extrusion stem such that the extrusion stem is moved from the first position to the second position.

4. The adhesive dispenser according to claim 1, wherein:

the spring retractable structure further comprises a stop part and a movable adhesive extrusion member, the stop part being fixed onto the adhesive dispensing tube, the movable adhesive extrusion member being connected with the extrusion stem and in contact with the adhesive, the movable adhesive extrusion member having an outer edge abutting against an inner surface of the adhesive dispensing tube, and two ends of the spring are connected with the stop part and the movable adhesive extrusion member respectively.

5. The adhesive dispenser according to claim 1, further comprising a carrying member carrying the plurality of adhesive dispensing parts.

6. The adhesive dispenser according to claim 5, wherein the carrying member comprises a rotatable carrying plate.

7. The adhesive dispenser according to claim 6, wherein the plurality of adhesive dispensing parts are distributed around a rotation axis of the rotatable carrying plate.

8. The adhesive dispenser according to claim 7, wherein the plurality of adhesive dispensing parts are arranged on the rotatable carrying plate along a circular trajectory about the rotation axis.

9. The adhesive dispenser according to claim 5, wherein the carrying member comprises a fixed carrying plate.

10. The adhesive dispenser according to claim 9, further comprising a force application disk, the force application disk being between the driving component and the fixed carrying plate and configured to transfer a force applied by the driving component to the adhesive extrusion assemblies.

11. The adhesive dispenser according to claim 10, wherein the driving component comprises a vertical turntable and a push rod connected with the vertical turntable, the push rod being movable up and down as the vertical turntable rotates so as to push and press the force application disk to thereby apply the force to the adhesive extrusion assembly.

12. The adhesive dispenser according to claim 1, wherein at least one of the adhesive dispensing parts further comprises a liquid level sensor configured to sense whether or not a liquid level of the adhesive is lower than a set position.

13. The adhesive dispenser according to claim 1, wherein at least one of the adhesive dispensing parts further comprises a temperature control sensor configured to sense a temperature of the adhesive.

14. The adhesive dispenser according to claim 1, wherein each of the adhesive dispensing parts further comprises an adhesive supply pipe configured to supply the adhesive to the adhesive dispensing tube.

* * * * *